United States Patent
Yamada

(10) Patent No.: US 10,036,965 B2
(45) Date of Patent: Jul. 31, 2018

(54) STAGE APPARATUS, LITHOGRAPHY APPARATUS, AND DEVICE MANUFACTURING METHOD

(71) Applicant: CANON KABUSHIKI KAISHA, Tokyo (JP)

(72) Inventor: Masanori Yamada, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 397 days.

(21) Appl. No.: 14/224,316

(22) Filed: Mar. 25, 2014

(65) Prior Publication Data

US 2014/0297019 A1 Oct. 2, 2014

(30) Foreign Application Priority Data

Mar. 26, 2013 (JP) .................................. 2013-064918

(51) Int. Cl.
G03F 7/20 (2006.01)

(52) U.S. Cl.
CPC ...... *G03F 7/70758* (2013.01); *G03F 7/70725* (2013.01); *G05B 2219/49284* (2013.01)

(58) Field of Classification Search
CPC ............. G03F 7/70725; G03F 7/70758; G05B 2219/49284
See application file for complete search history.

(56) References Cited

U.S. PATENT DOCUMENTS

| | | | | |
|---|---|---|---|---|
| 6,130,517 | A * | 10/2000 | Yuan | G03F 7/70816 318/593 |
| 7,737,419 | B2 | 6/2010 | Asano | |
| 2005/0078288 | A1* | 4/2005 | Pril | G03F 7/70775 355/53 |
| 2007/0013895 | A1* | 1/2007 | Okada | G03F 7/70725 355/72 |

(Continued)

FOREIGN PATENT DOCUMENTS

| | | |
|---|---|---|
| JP | 2003-168721 A | 6/2003 |
| JP | 2007-027331 A | 2/2007 |
| JP | 2008004647 A | 1/2008 |

OTHER PUBLICATIONS

Office Action issued in Japanese Appln. No. 2013064918 dated Jan. 20, 2017.

(Continued)

*Primary Examiner* — Jennifer L Norton
(74) *Attorney, Agent, or Firm* — Rossi, Kimms & McDowell LLP

(57) ABSTRACT

A stage apparatus includes: a coarse moving stage; a fine moving stage located at an interval from the coarse moving stage in a first direction; an electromagnetic actuator including a first core located on one of the coarse moving stage and the fine moving stage and a second core located on the other of the coarse moving stage and the fine moving stage and configured to accelerate or decelerate the fine moving stage in a second direction perpendicular to the first direction; and a controller configured to correct a command value of a (Continued)

thrust of the electromagnetic actuator in the second direction in accordance with a relative position of the fine moving stage with respect to the coarse moving stage in the first direction.

11 Claims, 5 Drawing Sheets

(56) References Cited

U.S. PATENT DOCUMENTS

| 2007/0284950 | A1* | 12/2007 | Ito | G03F 7/70716 |
| | | | | 310/12.06 |
| 2008/0067415 | A1* | 3/2008 | Asano | G03F 7/70758 |
| | | | | 250/440.11 |
| 2012/0281194 | A1* | 11/2012 | Asano | G03F 7/7085 |
| | | | | 355/67 |

OTHER PUBLICATIONS

Office Action issued in Japanese Appln. No. 2013-064918 dated Jan. 20, 2017. English translation provided.

* cited by examiner

STAGE APPARATUS, LITHOGRAPHY APPARATUS, AND DEVICE MANUFACTURING METHOD

BACKGROUND OF THE INVENTION

Field of the Invention

The present invention relates to a stage apparatus, a lithography apparatus, and a device manufacturing method.

Description of the Related Art

A semiconductor exposure apparatus is required to have high productivity and finer design rules. Accordingly, a stage to be driven with a substrate or an original placed on it is also required to be driven at a high speed and high accuracy. The stage of an exposure apparatus includes a coarse moving stage to be driven in a long stroke, and a fine moving stage capable of driving along six axes while holding a substrate or an original and arranged on the coarse moving stage. The fine moving stage required to be more accurately driven needs an actuator capable of driving the stage at a high efficiency and high accuracy with little heat. An example of an actuator having such a feature is an electromagnetic actuator using the principle of an electromagnet, which is used as the actuator of a fine moving stage.

The electromagnetic actuator is located to make an electromagnet and a magnetic material to face each other with a small gap. The electromagnet is located on one of the coarse moving stage and the fine moving stage, and the magnetic material is located on the other. An attraction force generated by a magnetic force becomes the thrust of the electromagnetic actuator. When driving the stages at a high acceleration, the fine moving stage is driven following the coarse moving stage by the thrust generated by the electromagnetic actuator.

The thrust generated by the electromagnetic actuator is known to be proportional to the square of a generated magnetic flux. In related arts described in Japanese Patent Laid-Open Nos. 2007-27331 and 2003-168721, a magnetic flux generated in an electromagnet is detected by a coil, and feedback control is performed to make the thrust generated by the electromagnet reach a target thrust.

The thrust generated by the electromagnetic actuator depends on the opposing area between the electromagnet and the magnetic material. In the control methods described in Japanese Patent Laid-Open Nos. 2007-27331 and 2003-168721, to correctly calculate the thrust of the electromagnetic actuator from the magnetic flux detected by the coil, the opposing area between the electromagnet and the magnetic material needs to have a predetermined value. If the thrust of the electromagnetic actuator cannot correctly be calculated, the controller of the actuator cannot correctly control the thrust. For this reason, the target thrust cannot be supplied to the fine moving stage, and the driving accuracy lowers.

When the electromagnet and the magnetic material face along the x or y direction, the opposing area between the electromagnet and the magnetic material changes upon driving the fine moving stage on which the electromagnet or the magnetic material is located in the z direction. Hence, when the fine moving stage is driven in the z direction, the thrust of the electromagnetic actuator cannot correctly be controlled. It is therefore impossible to drive the fine moving stage in the x and y directions at a high acceleration and high accuracy. The fine moving stage is driven in the z direction when aligning an exposure amount measurement sensor or a reference mark on the fine moving stage with the best focus plane of a lens or transferring a substrate from a transportation apparatus to the stage. In this case, a measure of, for example, lowering the driving accelerations in the x and y directions is necessary to prevent the driving accuracy of the fine moving stage from lowering. This impedes an increase in the throughput of the exposure apparatus.

SUMMARY OF THE INVENTION

The present invention provides a stage apparatus capable of accurately driving a fine moving stage independently of its position.

The present invention in its one aspect provides a stage apparatus comprising: a coarse moving stage; a fine moving stage: located at an interval from the coarse moving stage in a first direction; an electromagnetic actuator including a first core located on one of the coarse moving stage and the fine moving stage and a second core located on the other of the coarse moving stage and the fine moving stage and configured to accelerate or decelerate the fine moving stage in a second direction perpendicular to the first direction; and a controller configured to correct a command value of a thrust of the electromagnetic actuator in the second direction in accordance with a relative position of the fine moving stage with respect to the coarse moving stage in the first direction.

Further features of the present invention will become apparent from the following description of exemplary embodiments with reference to the attached drawings.

DESCRIPTION OF THE EMBODIMENTS

Figure 7:
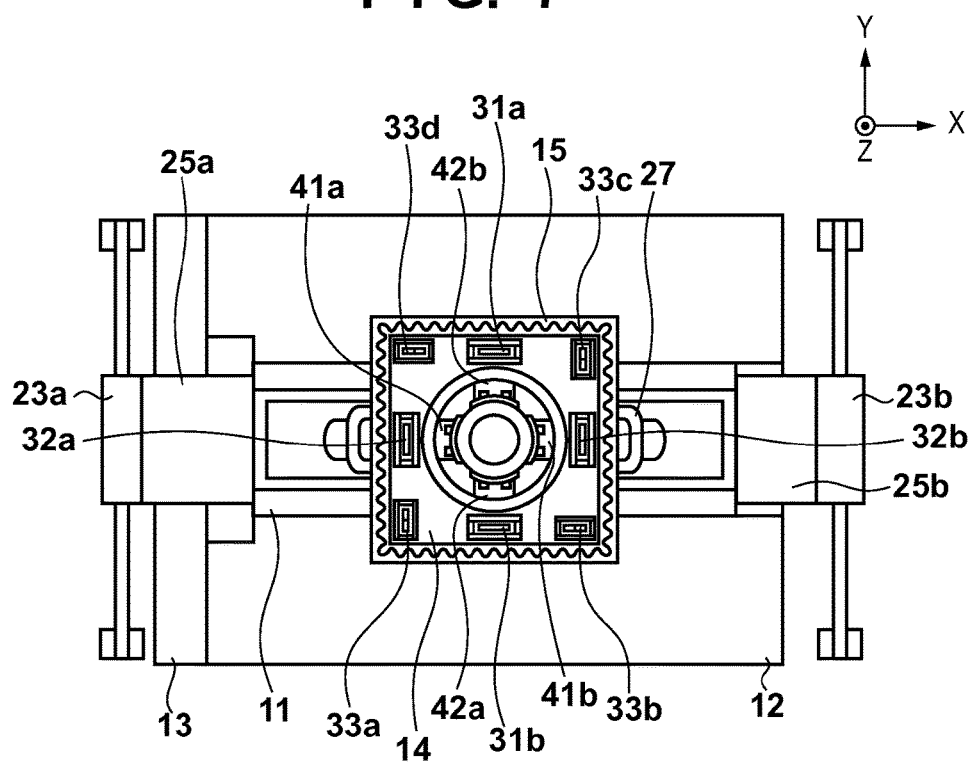
FIG. 7 is a view of a stage apparatus.

An embodiment of the present invention will now be described in detail with reference to the accompanying drawings. FIG. 7 is a view of a stage apparatus that holds a substrate or an original in an exposure apparatus according to an embodiment of the present invention. In this embodiment, the stage apparatus according to the present invention is used in an exposure apparatus. However, the stage apparatus is also usable in another lithography apparatus such as an imprint apparatus for forming a pattern of an original on a substrate. A y coarse moving stage 11 is driven in the y direction using a base 12 whose guide surface with respect to the y coarse moving stage 11 is formed into a mirror plane, a yaw guide 13, and a static pressure guide (not shown). An x coarse moving stage 15 is configured to causes static pressure guides (not shown) to sandwich the y coarse moving stage 11 on the base 12, and driven in the x direction along the y coarse moving stage 11.

A linear motor for driving the y coarse moving stage 11 is constituted by y linear motor movable elements 23a and 23b each formed from a coil. The y coarse moving stage 11 is connected to y linear motors by connection plates 25a and 25b. The y coarse moving stage 11 is positioning-controlled by a control system (not shown) and the linear motors.

Similarly, a linear motor 27 for driving the x coarse moving stage 15 is constituted by an x coarse linear motor stator provided on the y coarse moving stage 11, and an x coarse linear motor movable element (not shown). The x position of the x coarse moving stage 15 is controlled using the x coarse linear motors 27 and a control system (not shown).

An x fine moving stage 14 is located at an interval in the z direction from the x coarse moving stage 15. Fine moving x linear motors 31a and 31b, fine moving y linear motors 32a and 32b, and fine moving z linear motors 33a, 33b, 33c, and 33d, which generate driving forces in the x, y, and z directions, are located between the x coarse moving stage 15 and the x fine moving stage 14. The linear motors 31 to 33 are controlled along six axes (x, y, and z directions and rotation directions about the respective axes) by control systems that are independent for each axis. The z direction is a direction (second direction) perpendicular to the surface of the x coarse moving stage 15, and the x and y directions are directions perpendicular to the Z direction.

Electromagnetic actuators 41 and 42 are formed between the x coarse moving stage 15 and the x fine moving stage 14, and attraction forces are generated by the actions of the electromagnets. Electromagnetic actuators 41a and 41b generate an attraction force in the x direction, and electromagnetic actuators 42a and 42b generate an attraction force in the y direction.

Figure 2:
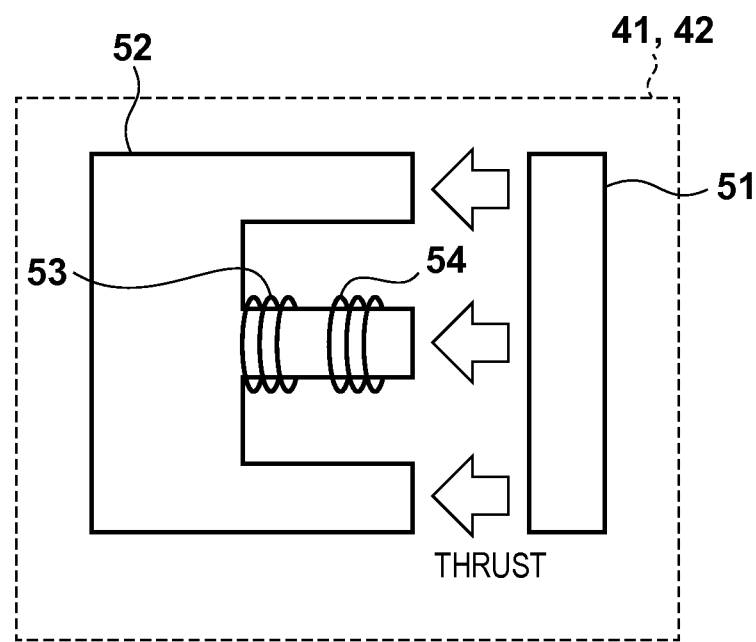
FIG. 2 is a view of the electromagnetic actuator.

FIG. 2 shows the arrangement of the electromagnetic actuators 41 and 42. Each of the electromagnetic actuators 41 and 42 is formed from an E core 52 (first core) that functions as an electromagnet, and an I core 51 (second core) that is a magnetic material. When a coil 53 is wound around the E core 52, and a current is supplied, a magnetic flux is generated, and magnetic poles are generated in the E core 52 and the I core 51. An attraction force by a magnetic force generated between the E core 52 and the I core 51 is the thrust of the electromagnetic actuators 41 or 42. One of the E core 52 and the I core 51 is located on the x coarse moving stage 15, and the other is located on the fine moving stage 14. A magnetic flux detection coil 54 is formed on the E core 52. A time change in the magnetic flux is generated as an induced voltage in the magnetic flux detection coil 54. Magnetic fluxes generated in the electromagnetic actuators 41 and 42 can be detected by integrating the induced voltage. The thrust of the electromagnetic actuators 41 or 42 is calculated using the fact that the thrust of the electromagnetic actuators 41 or 42 is proportional to the square of the magnetic flux.

Figure 3:
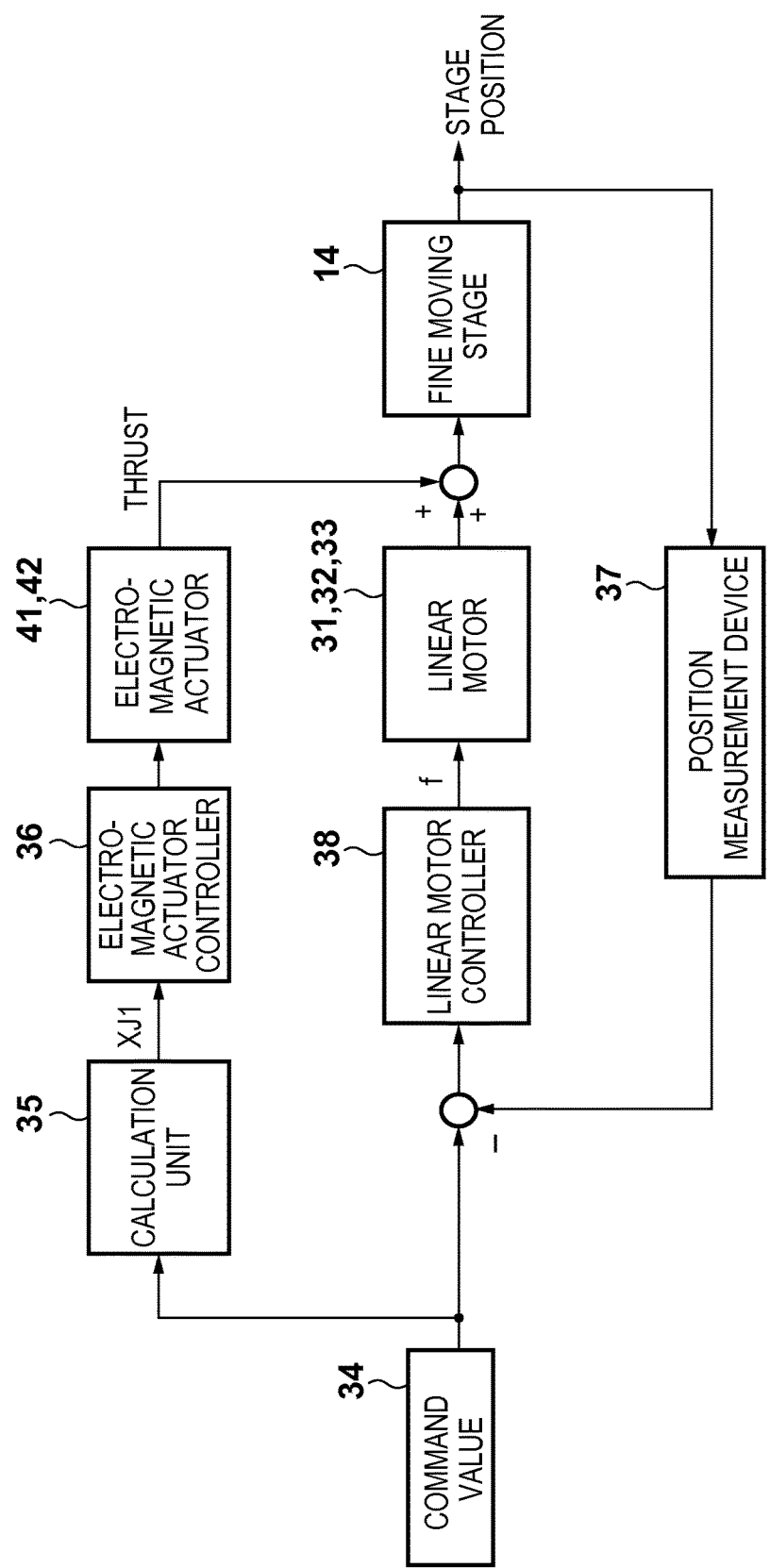
FIG. 3 is a control block diagram of a fine moving stage.

FIG. 3 is a control block diagram for the x and y positions of the fine moving stage 14 to which the thrusts of the electromagnetic actuators 41 and 42 contribute. The position of the fine moving stage 14 is measured by a position measurement device 37 such as a laser interferometer or an encoder. A linear motor controller 38 of PID control or the like calculates command values φ to the linear motors 31, 32, and 33 by feedback control from an error that is the difference between a command value 34 and the position of the fine moving stage 14. The thrust of the electromagnetic actuators 41 or 42, which is output from an electromagnetic actuator controller 36, is supplied to the fine moving stage 14 only when accelerating or decelerating it. A target value F of the thrust of the electromagnetic actuators 41 or 42 is calculated by $$F = m \times a \quad (1)$$

where m is the mass (kg) of the fine moving stage 14, and a is the acceleration (m/s$^2$) of the fine moving stage 14.

A calculation unit 35 calculates a magnetic flux command value XJ1 using the fact that the thrust of the electromagnetic actuators 41 or 42 is proportional to the square of the magnetic flux, and outputs the magnetic flux command value XJ1 to the electromagnetic actuator controller 36 (controller). When the fine moving stage 14 is driven in the x or y direction in a state in which the thrust of the electromagnetic actuators 41 or 42 changes, the linear motors 31 or 32 of the fine moving stage 14 compensate for the change amount of the thrust of the electromagnetic actuators 41 or 42. Hence, the command value φ to the linear motors 31 or 32 changes.

The linear motors 31 and 32 control the precise x and y positions of the fine moving stage 14 on the nm order, and the electromagnetic actuators 41 and 42 are used to apply thrusts necessary for acceleration or deceleration. This makes it possible to cause the fine moving stage 14 to follow the coarse moving stages 11 and 15 at a high acceleration and also position the fine moving stage 14 on the nm order at the time of exposure.

Figure 1:
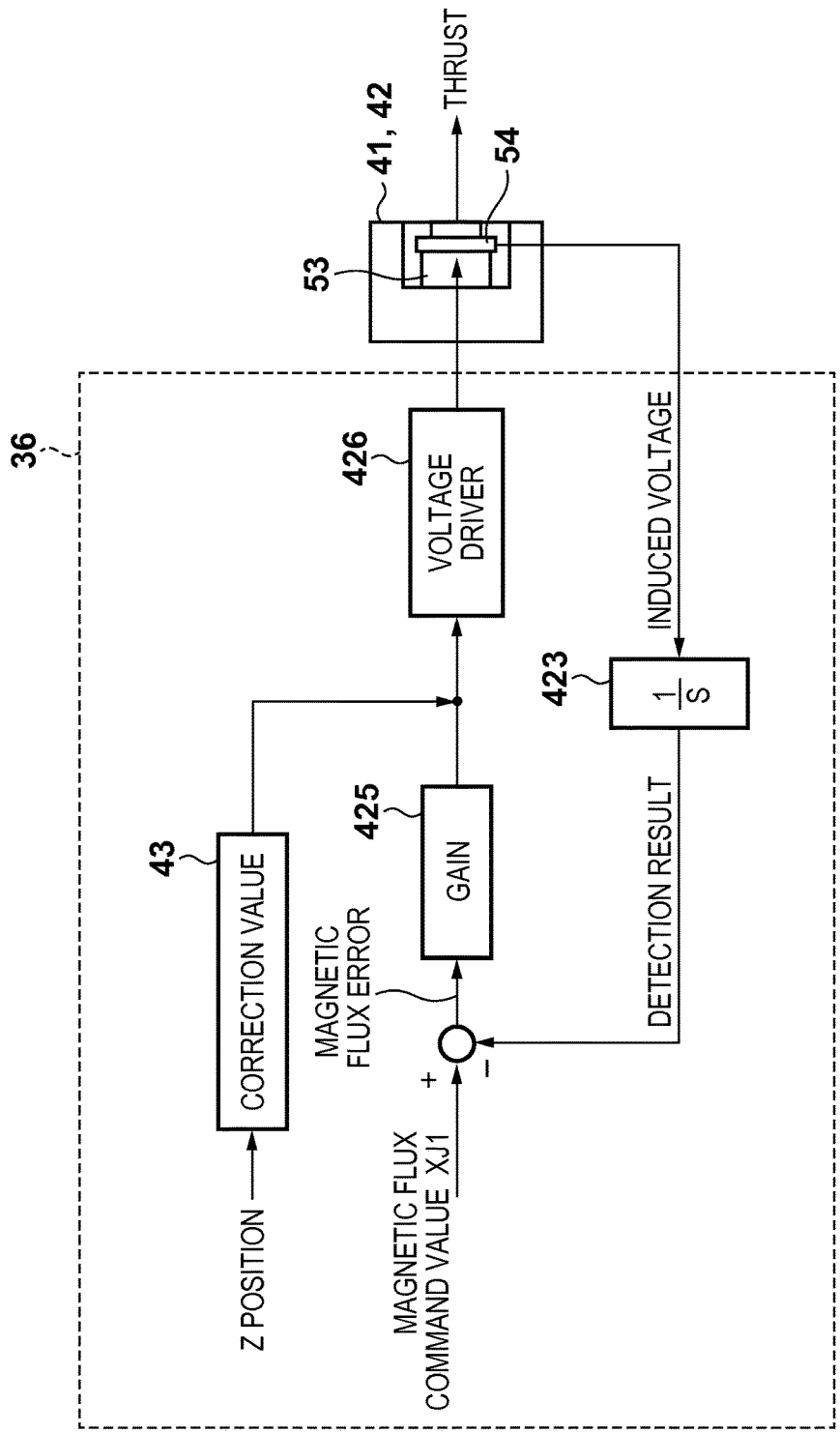
FIG. 1 is a control block diagram of an electromagnetic actuator.

FIG. 1 shows the details of the electromagnetic actuator controller 36 shown in FIG. 3. The electromagnetic actuator controller 36 causes the magnetic flux detection coil 54 to detect a magnetic flux generated by the electromagnetic actuators 41 or 42 and inputs the value to an integrator 423, thereby obtaining a magnetic flux detection result. An adder 424 calculates the magnetic flux error that is the difference between the magnetic flux command value XJ1 and the detected magnetic flux. An amplifier 425 multiplies the magnetic flux error by a gain, and sends the command value to a voltage driver 426. The voltage driver 426 applies a voltage to the coil 53 of the electromagnetic actuators 41 or 42. When a current flows to the coil 53, a thrust by an attraction force is generated. The electromagnetic actuator controller 36 equivalently controls the thrust by controlling the magnetic flux using the fact that the thrust of the electromagnetic actuators 41 or 42 is proportional to the square of the magnetic flux.

As a characteristic feature of the present invention, the magnetic flux command value (thrust command value) XJ1 is corrected in accordance with the position of the fine moving stage 14 relative to the x coarse moving stage 15 in the z direction. Methods of correcting the magnetic flux command value XJ1 will be described in detail in the following examples.

Example 1

Figure 4:
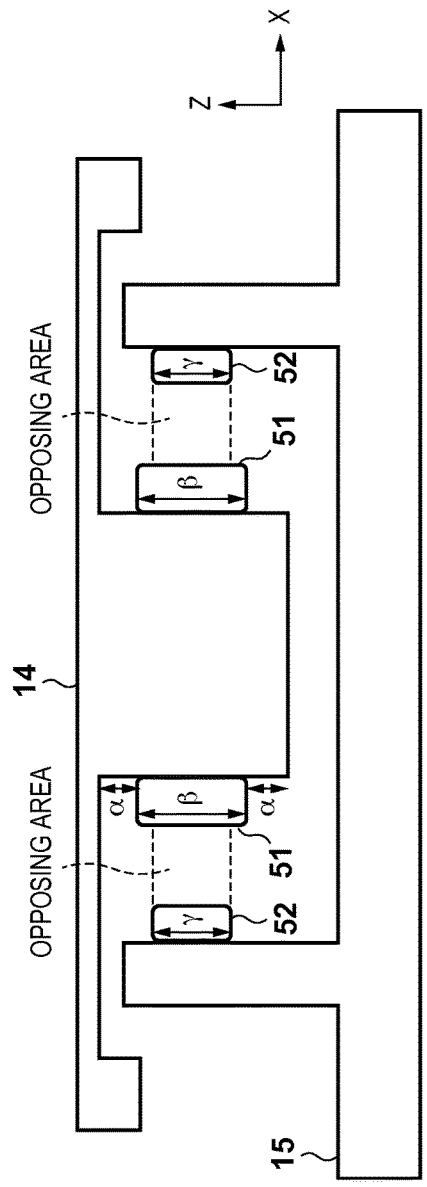
FIG. 4 is a sectional view of a stage apparatus taken along the x-z plane.

FIG. 4 is a sectional view of the fine moving stage 14 and the x coarse moving stage 15 in FIG. 1 taken along the x-z plane. In FIG. 4, the electromagnet (E core) 52 is located on the x coarse moving stage 15, and the magnetic material (I core) 51 is located on the fine moving stage 14. A reversed combination is also available. The absolute value of the difference between a z-direction length β of the magnetic material 51 and a z-direction length γ of the electromagnet 52 is set to be smaller than a z-direction movable range α of the fine moving stage 14, as represented by $$|\beta - \gamma| < \alpha \quad (2)$$

Figure 5:
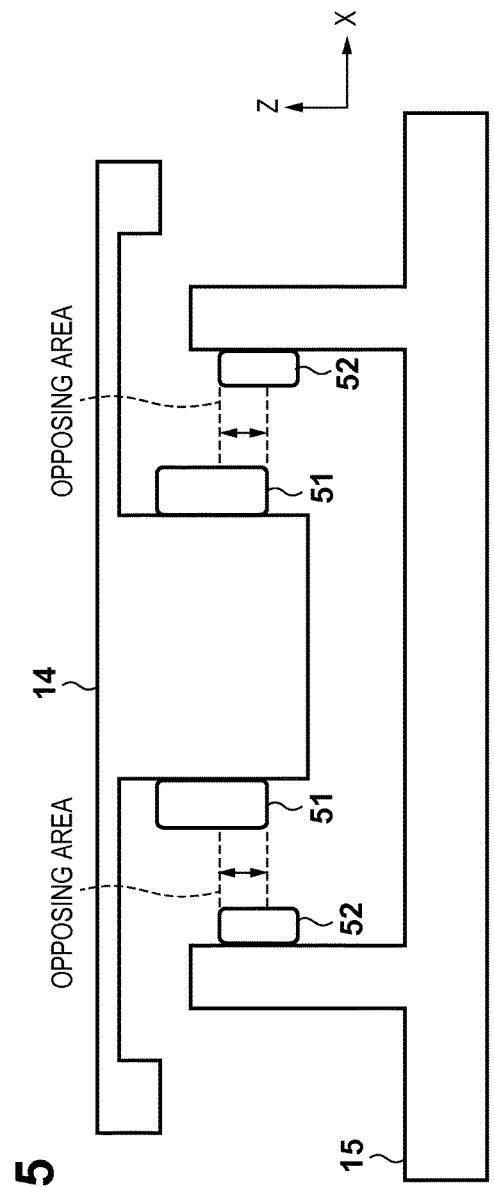
FIG. 5 is a sectional view of the stage apparatus taken along the x-z plane.

By meeting inequality (2), a section where the opposing area between the electromagnet 52 and the magnetic material 51 changes upon driving the fine moving stage 14 in the z direction is provided (FIG. 5).

The relationship between the thrust generated by the electromagnetic actuators 41 or 42 and the opposing area between the electromagnet 52 and the magnetic material 51 is known to be formulized by $$F \propto K \times I^2 \times S \quad (3)$$

where F is the thrust, K is a coefficient determined by the permeability, gap, and the like between the electromagnet and the magnetic material, I is the current, and S is the opposing area.

In expression (3), the opposing area is necessary to calculate the thrust. To cause the electromagnetic actuators 41 or 42 to generate a target thrust, the relationship between the opposing area and the z position of the fine moving stage 14 needs to be accurately measured. In the stage apparatus, however, the relationship is difficult to accurately measure.

In Example 1, using the fact that a variation in the thrust caused by a change in the z position of the fine moving stage 14 appears in the command value φ of the linear motor controller 38 shown in FIG. 3 to the linear motors 31 or 32, the magnetic flux command value XJ1 is corrected in accordance with the z position of the fine moving stage 14. A method of calculating the correction amount (correction coefficient) of the magnetic flux command value XJ1 will be described next.

First, the command value φ to the linear motors 31 or 32 of the fine moving stage 14 when the fine moving stage 14 is driven in the x or y direction at a z position at which the opposing area is maximized, and the acceleration is maximized or minimized is stored as reference data. When the fine moving stage 14 is driven in the x direction, a command value to the linear motors 31 is stored. When the fine moving stage 14 is driven in the y direction, a command value to the linear motors 32 is stored.

The z position of the fine moving stage 14 is then changed, and the fine moving stage 14 is driven under the same driving conditions. A correction amount 43 is adjusted such that the maximum current value at that time equals the command value when the fine moving stage 14 is driven in the x or y direction at the z position at which the opposing area is maximized. The magnetic flux command value XJ1 is multiplied by the correction amount 43.

Figure 6:
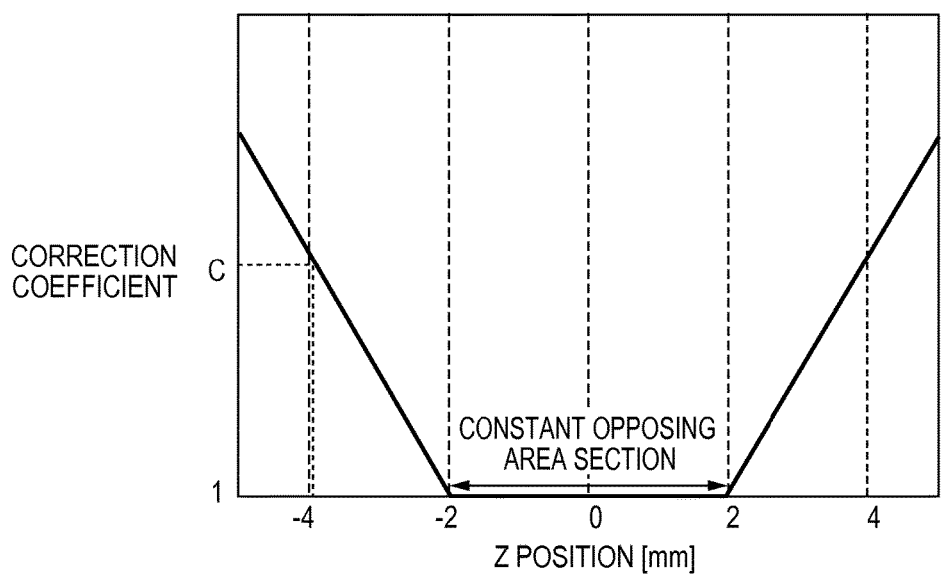
FIG. 6 is a graph showing a correction amount to a magnetic flux command value.

The same measurement as described above is performed at a plurality of z positions, and information of the correction amount 43 of a current to the electromagnetic actuators 41 or 42 at an arbitrary z position is generated. The information of the correction amount 43 may be used as a table by the z position, or used by calculating an approximate expression from a measurement result. FIG. 6 shows an example of the information of the correction amount. As a feature, the farther the z position is away from the position where the opposing area is maximum, the larger the correction amount is.

The correction amount is 1 in a section where the opposing area remains unchanged even when the z position of the fine moving stage 14 changes. In a section where the opposing area changes, the magnetic flux command value is multiplied by the correction amount in accordance with the position of the fine moving stage 14. For example, in FIG. 6, when the z position is −4 mm, the magnetic flux command value is multiplied by a correction amount C referred from a table obtained in advance or an approximate expression.

Example 2

A variation in the thrust of the electromagnetic actuators 41 or 42 is also observed as a variation in a control error that is the difference between the position of the fine moving stage 14 and the command value 34 of the control block of the fine moving stage 14 in FIG. 3. Hence, as in Example 1, a control error when the fine moving stage 14 is driven in the x or y direction at a z position at which the opposing area is maximized, and the acceleration is maximized or minimized is stored as reference data. As in Example 1, when the fine moving stage 14 is driven in the x direction, an error in the x direction is stored. When the fine moving stage 14 is driven in the y direction, a control error in the y direction is stored.

The position of the fine moving stage 14 is changed in the z direction, and the fine moving stage 14 is driven in the x or y direction under the same conditions. The correction amount 43 is adjusted such that the maximum error at that time equals the maximum error at the z position at which the opposing area is maximized. The same measurement as described above is performed at a plurality of z positions, and information of the correction amount 43 at an arbitrary z position is generated. The information of the correction amount 43 may be used as a table by the z position, or used by calculating an approximate expression from a measurement result.

[Device Manufacturing Method]

A method of manufacturing a device (semiconductor device, liquid crystal display device, or the like) will be described next. The semiconductor device is manufactured by pre-processing of forming an integrated circuit on a wafer and post-processing of completing the integrated circuit chip formed on the wafer by the pre-processing as a product. The pre-processing includes a process of exposing the wafer with an applied photoresist using the above-described exposure apparatus, and a process of developing the wafer. The post-processing includes an assembly process (dicing and bonding) and a packaging process (encapsulation). The liquid crystal display device is manufactured by a process of forming a transparent electrode. The process of forming a transparent electrode includes a process of applying a photoresist to a glass substrate on which a transparent conductive film is deposited, a process of exposing the glass substrate with the applied photoresist using the above-described exposure apparatus, and a process of developing the glass substrate. According to the device manufacturing method of this embodiment, it is possible to manufacture a device of higher quality than before.

While the present invention has been described with reference to exemplary embodiments, it is to be understood that the invention is not limited to the disclosed exemplary embodiment. The scope of the following claims is to be accorded the broadest interpretation so as to encompass all such modifications and equivalent structures and functions.

This application claims the benefits of Japanese Patent Application No. 2013-064918, filed Mar. 26, 2013, which is hereby incorporated by reference herein in its entirety.

What is claimed is:

1. A stage apparatus comprising:
    a coarse moving stage;
    a fine moving stage;
    an electromagnetic actuator including a first core located on the coarse moving stage and a second core located on the fine moving stage and configured to accelerate or decelerate the fine moving stage in a first direction in which the first core and the second core are arranged with a first side of the first core and a second side of the second core opposing each other; and
    a controller configured to correct a command value of a thrust of the electromagnetic actuator in the first direction in accordance with an opposing area of a difference between a length of the first side of the first core and a length of the second side of the second core in a second direction perpendicular to the first direction, wherein the controller corrects the command value using a first correction amount in a case where the opposing area of the difference between the length of the first side of the first core and the length of the second side of the second core is a first area and corrects the command value using a second correction amount which is larger than the first correction amount in a case where the opposing area of the difference between the length of the first side of the first core and the length of the second side of the second core is a second area which is smaller than the first area.

2. The apparatus according to claim 1, wherein the opposing area of the difference between the length of the first side of the first core and the length of the second side of the second core is changed in accordance with a relative position of the fine moving stage with respect to the coarse moving stage in a second direction perpendicular to the first direction, and the controller corrects the command value based on information representing a relationship between the relative position of the fine moving stage with respect to the coarse moving stage and a correction amount of the command value.

3. The apparatus according to claim 2, further comprising a linear motor configured to position the fine moving stage in the first direction, wherein the information is generated using the command value of the thrust of the linear motor in the first direction when the fine moving stage is driven along the first direction while changing the relative position.

4. The apparatus according to claim 2, wherein the information is generated using a control error of the fine moving stage when the fine moving stage is driven along the first direction while changing the relative position.

5. The apparatus according to claim 1, wherein the first core comprises one of an E core and an I core, and the second core comprises the other one of the E core and the I core.

6. A lithography apparatus for forming a pattern of an original on a substrate, the lithography apparatus comprising:

a stage apparatus configured to hold at least one of the original and the substrate,
the stage apparatus including:
a coarse moving stage;
a fine moving stage;
an electromagnetic actuator including a first core located on the coarse moving stage and a second core located on the fine moving stage and configured to accelerate or decelerate the fine moving stage in a first direction in which the first core and the second core are arranged with a first side of the first core and a second side of the second core opposing each other; and
a controller configured to correct a command value of a thrust of the electromagnetic actuator in the first direction in accordance with an opposing area of a difference between a length of the first side of the first core and a length of the second side of the second core in a second direction perpendicular to the first direction, wherein the controller corrects the command value using a first correction amount in a case where the opposing area of the difference between the length of the first side of the first core and the length of the second side of the second core is a first area and corrects the command value using a second correction amount which is larger than the first correction amount in a case where the opposing area of the difference between the length of the first side of the first core and the length of the second side of the second core is a second area which is smaller than the first area.

7. A method of manufacturing a device, the method comprising:

forming a pattern of an original on a substrate using a lithography apparatus according to claim 6;
developing the substrate on which the pattern is formed; and
processing the developed substrate to manufacture the device.

8. The apparatus according to claim 2, wherein the correction amount is constant while the opposing area of the difference between the length of the first side of the first core and the length of the second side of the second core is constant at a predetermined opposing area.

9. The apparatus according to claim 3, wherein the first area is a maximum opposing area of the difference between the length of the first side of the first core and the length of the second side of the second core, and the second correction amount is set such the command value of the thrust of the linear motor in the first direction where the opposing area of the difference between the length of the first side of the first core and the length of the second side of the second core is the second area becomes equal to the command value of the thrust of the linear motor in the first direction where the opposing area of the difference between the length of the first side of the first core and the length of the second side of the second core is the first area.

10. The apparatus according to claim 4, wherein the first area is a maximum opposing area of the difference between the length of the first side of the first core and the length of the second side of the second core, and the second correction amount is set such that the maximum control error when the electromagnetic actuator moves the fine moving stage in the first direction in a state where the opposing area of the difference between the length of the first side of the first core and the length of the second side of the second core is the second area becomes equal to the maximum control error when the electromagnetic actuator moves the fine moving stage in the first direction in a state where the opposing area of the difference between the length of the first side of the first core and the length of the second side of the second core is the first area.

11. The apparatus according to claim 4, wherein the control error is a difference between a command value of the fine moving stage and a position of the fine moving stage.

* * * * *